United States Patent
Kolmhofer

(10) Patent No.: US 7,795,889 B2
(45) Date of Patent: Sep. 14, 2010

(54) PROBE DEVICE

(75) Inventor: Erich Kolmhofer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 12/020,251

(22) Filed: Jan. 25, 2008

(65) Prior Publication Data

US 2009/0189621 A1  Jul. 30, 2009

(51) Int. Cl.
*G01R 31/02* (2006.01)

(52) U.S. Cl. .......................... 324/754; 324/761

(58) Field of Classification Search ............. 324/158.1, 324/750–755, 455–446, 437, 690; 439/758, 439/591
See application file for complete search history.

(56) References Cited

U.S. PATENT DOCUMENTS

| | | | |
|---|---|---|---|
| 4,853,624 A | 8/1989 | Rabjohn | |
| 4,962,359 A * | 10/1990 | Dunsmore | 324/638 |
| 5,512,835 A | 4/1996 | Rivera et al. | |
| 5,561,378 A | 10/1996 | Bockelman et al. | |
| 6,614,243 B2 | 9/2003 | Klehn et al. | |
| 7,157,923 B2 | 1/2007 | Schneider et al. | |
| 7,199,684 B2 | 4/2007 | Aigner et al. | |
| 7,212,019 B2 | 5/2007 | Schneegans et al. | |
| 7,423,595 B2 * | 9/2008 | Saily | 343/700 MS |
| 7,561,007 B1 * | 7/2009 | Heissler | 333/164 |
| 2006/0005089 A1 | 1/2006 | Bucksch | |
| 2007/0257834 A1 | 11/2007 | Tiebout | |
| 2008/0012591 A1 * | 1/2008 | Campbell et al. | 324/754 |

OTHER PUBLICATIONS

M/ACOM application note entitled "RF Balun Transformers," pp. 10-25-10-28.
Cascade Microtech, Inc. webpage entitled "Elite 300—The Next Step in 300mm Probing," 1 pg.; Jan. 25, 2008.
Infineon webpage entitled "Highly Integrated Solutions for the Automotive Radar RF Frontend," 2 pgs.; Jan. 25, 2008.
Taconic Add webpage entitled "Taconic RF & Microwave Laminates," 3 pgs.; Jan. 25, 2008.

* cited by examiner

*Primary Examiner*—Minh N Tang
*Assistant Examiner*—Trung Q Nguyen
(74) *Attorney, Agent, or Firm*—Dicke, Billig & Czaja, PLLC

(57) ABSTRACT

A probe device for testing a semiconductor chip includes a substrate and a balun formed on the substrate. The balun includes first and second differential ports and a single-ended port. The probe device includes first and second probe tips respectively coupled to the first and second differential ports.

16 Claims, 4 Drawing Sheets

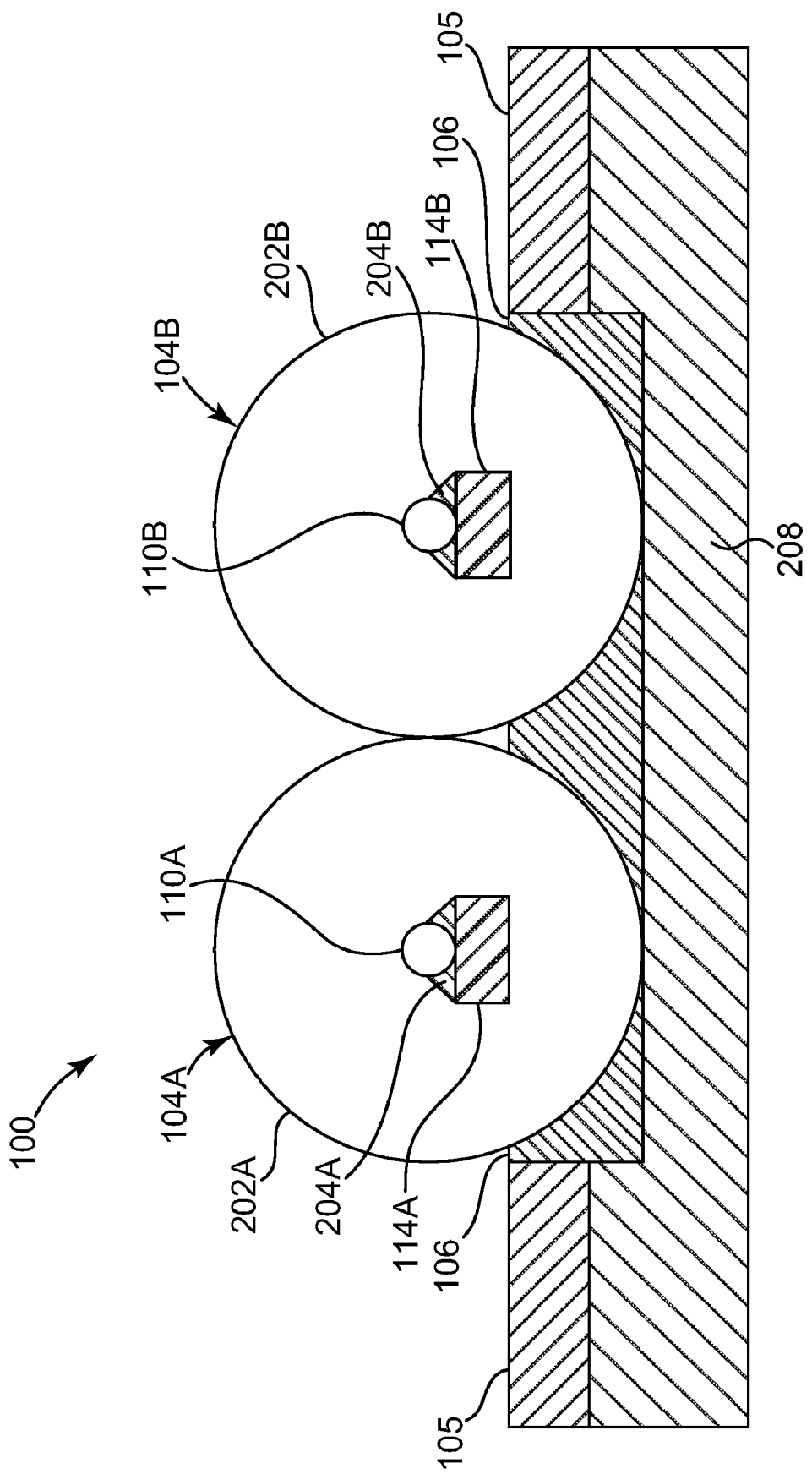

PROBE DEVICE

BACKGROUND

Semiconductor integrated circuits (ICs) are manufactured using complex and time consuming processes to fabricate a wafer having large numbers of individual IC "chips". Semiconductor chips are tested individually or in wafer form. Contact surfaces (e.g., bond pads) are electrically contacted on the chip and connected via a probe device to test equipment (e.g., a test circuit). Electronic test signals are applied to the circuit on the chip via the test equipment and the probe device, and the response to these test signals is measured and evaluated.

Differential circuits are more difficult to design and test than typical single-ended circuits, particularly when such differential circuits are designed to process signals carried on radio and microwave frequencies. For example, some automotive radar systems use differential circuits that process signals at microwave frequencies. Electrical metrology and characterization of these devices is problematic at frequencies around 80 GHz, particularly if differential signals are supplied to or received from a device in wafer level testing. Due to the tolerances of cables and connectors, conventional approaches for testing such devices are not viable at higher microwave frequencies since imperfections adversely affect the ability to establish the 180° phase relation between the differential signal components with the desired accuracy.

SUMMARY

One embodiment provides a probe device for testing a semiconductor chip. The probe device includes a substrate and a balun formed on the substrate. The balun includes first and second differential ports and a single-ended port. The probe device includes first and second probe tips respectively coupled to the first and second differential ports.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 is a diagram illustrating a cross-sectional view of the probe device shown in FIG. 1 according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
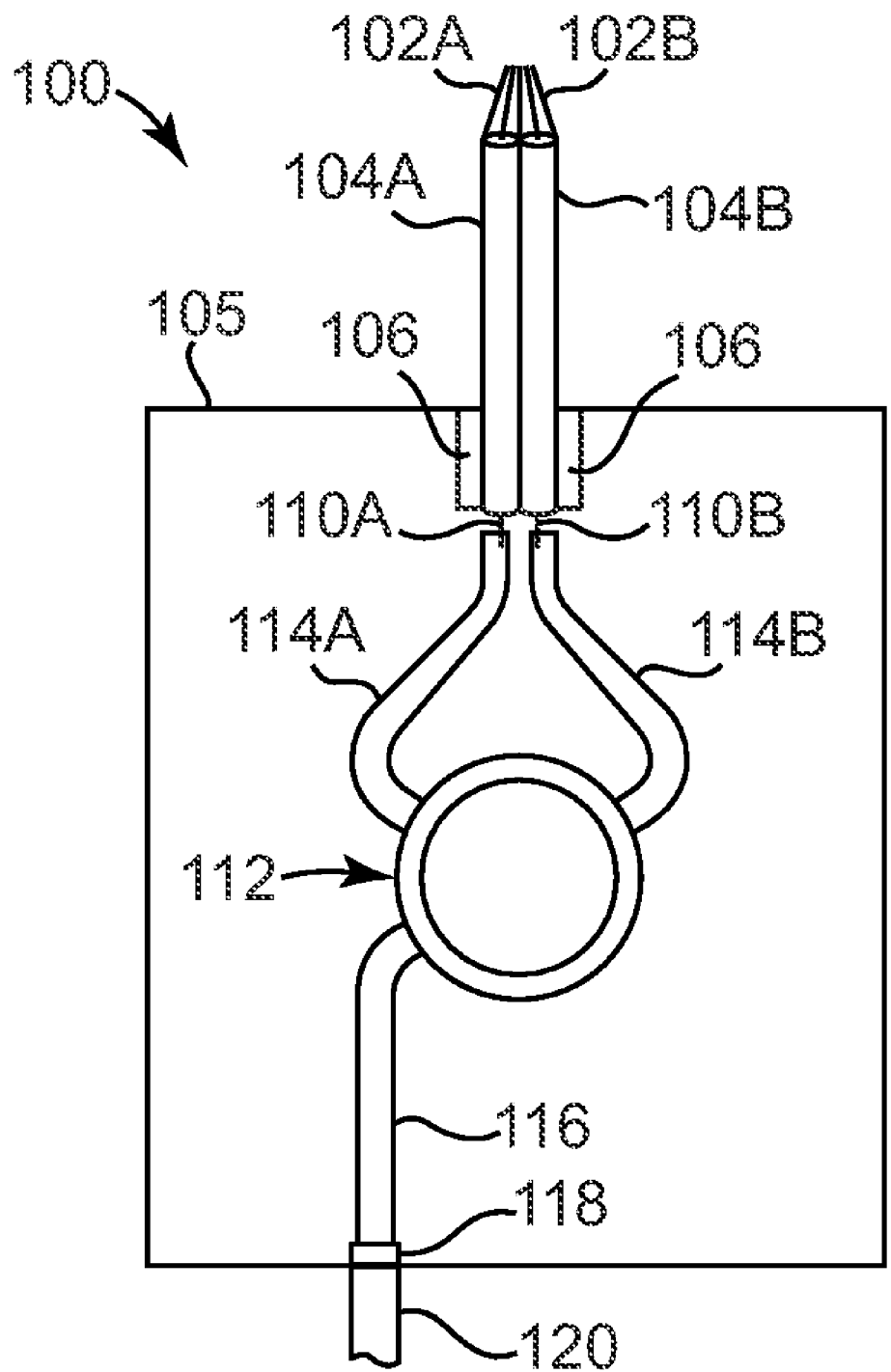
FIG. 1 is a diagram illustrating a top view of a probe device for testing a semiconductor chip according to one embodiment.

FIG. 1 is a diagram illustrating a top view of a probe device 100 for testing a semiconductor chip according to one embodiment. FIG. 2 is a diagram illustrating a cross-sectional view of the probe device 100 shown in FIG. 1 according to one embodiment. Probe device 100 includes probe tips 102A and 102B, coaxial conductors 104A and 104B, substrate 105, balun 112, and communication link 120. Substrate 105 includes connector 118 and ground plane 208. Balun 112 is formed on or in substrate 105. Balun 112 includes two balanced (differential) RF ports 114A and 114B, and an unbalanced (single-ended) RF port 116. Balun 112 matches the single-ended RF port 116 with the two differential RF ports 114A and 114B (i.e., converts single-ended RF signals to differential RF signals, and vice versa).

Probe tips 102A and 102B are configured to make electrical contact with pads of a semiconductor chip, either in singulated form or on a wafer. Probe tips 102A and 102B are connected to coaxial conductors 104A and 104B, respectively. Coaxial conductors 104A and 104B are connected to substrate 105. In one embodiment, coaxial conductors 104A and 104B are connected to substrate 105 by soldering or conductive gluing. Coaxial conductor 104A includes outer conductor 202A and inner conductor 110A, and coaxial conductor 104B includes outer conductor 202B and inner conductor 110B. The outer conductor 202A of coaxial conductor 104A is connected to the ground plane 208 of substrate 105 via connection 106. The outer conductor 202B of coaxial conductor 104B is also connected to the ground plane 208 of substrate 105 via connection 106. The inner conductor 10A of coaxial conductor 104A is connected to differential port 114A of the balun 112 via connection 204A. The inner conductor 110B of coaxial conductor 104B is connected to differential port 114B of the balun 112 via connection 204B. In one embodiment, connections 106, 204A, and 204B are solder or glue connections.

The single-ended port 116 of the balun 112 is connected to connector 118 of substrate 105. Communication link 120 is also connected to connector 118. In one embodiment, communication link 120 is a coaxial conductor. In another embodiment, communication link 120 is a waveguide. In yet another embodiment, communication link 120 is configured to be coupled directly to the single-ended port 116 of the balun 112 without the use of a connector 118. Communication link 120 is configured to be coupled to test equipment.

In one embodiment, substrate 105 is a microwave substrate (e.g., a dielectric material with low loss characteristics suitable for use with microwave frequency signals). Substrate 105 is a ceramic, alumina, or Polytetrafluoroethylene (PTFE) substrate in one embodiment. In one embodiment, balun 112 is a ring hybrid balun, delay line balun, or transformer balun. In a specific embodiment, balun 112 is a transmission line balun that is integrated into or onto substrate 105. The transmission lines are formed in one embodiment by disposing conductors in a microstrip arrangement at or near the surface of the substrate 105. Conventional photolithography and micro-structuring techniques, which are commonly used for manufacturing circuits on microwave substrates, are used in one embodiment to form balun 112 and control the conductor lengths of balun 112 to achieve the desired phase relations with appropriate accuracy.

Figure 3A:
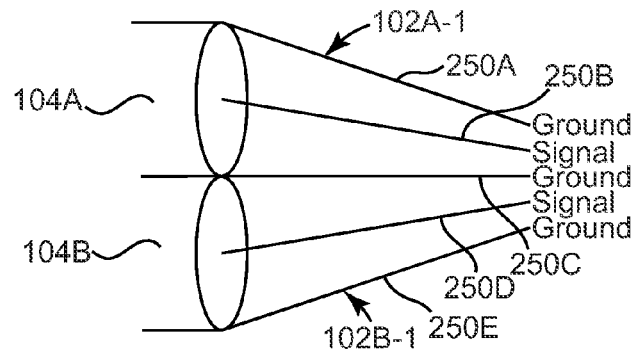
FIGS. 3A-3D are diagrams illustrating embodiments of the probe tips of the probe device shown in FIG. 1.
Figure 3B:
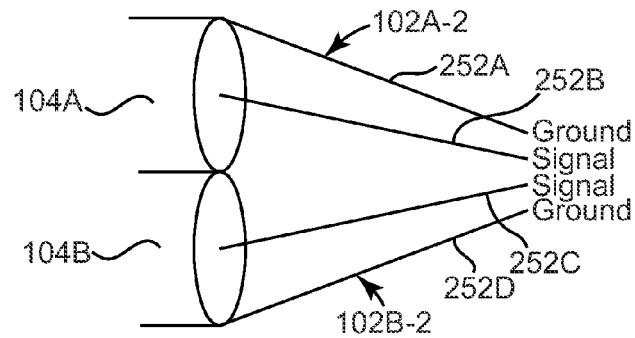
Figure 3C:
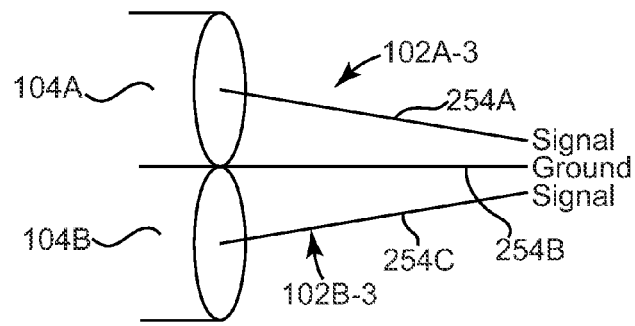
Figure 3D:
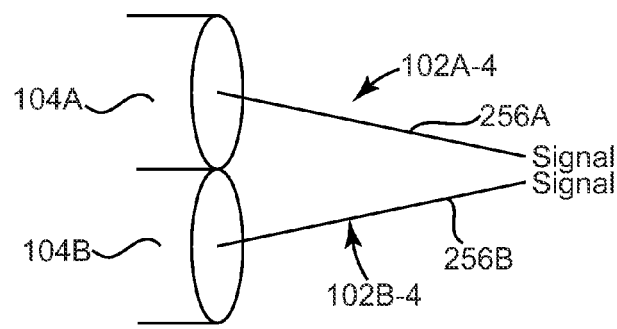

FIGS. 3A-3D are diagrams illustrating embodiments of the probe tips 102A and 102B of the probe device 100 shown in FIG. 1. FIG. 3A shows an embodiment in which probe tips 102A-1 and 102B-1 include five needles 250A-250E in a GSGSG configuration, where "G" represents ground and indicates a needle connected to one of the outer coaxial conductors, and "S" represents signal and indicates a needle connected to one of the inner coaxial conductors. FIG. 3B shows an embodiment in which probe tips 102A-2 and 102B-2 include four needles 252A-252D in a GSSG configuration. FIG. 3C shows an embodiment in which probe tips 102A-3 and 102B-3 include three needles 254A-254C in an SGS configuration. FIG. 3D shows an embodiment in which probe tips 102A-4 and 102B-4 include two needles 256A-256B in an SS configuration.

Figure 4:
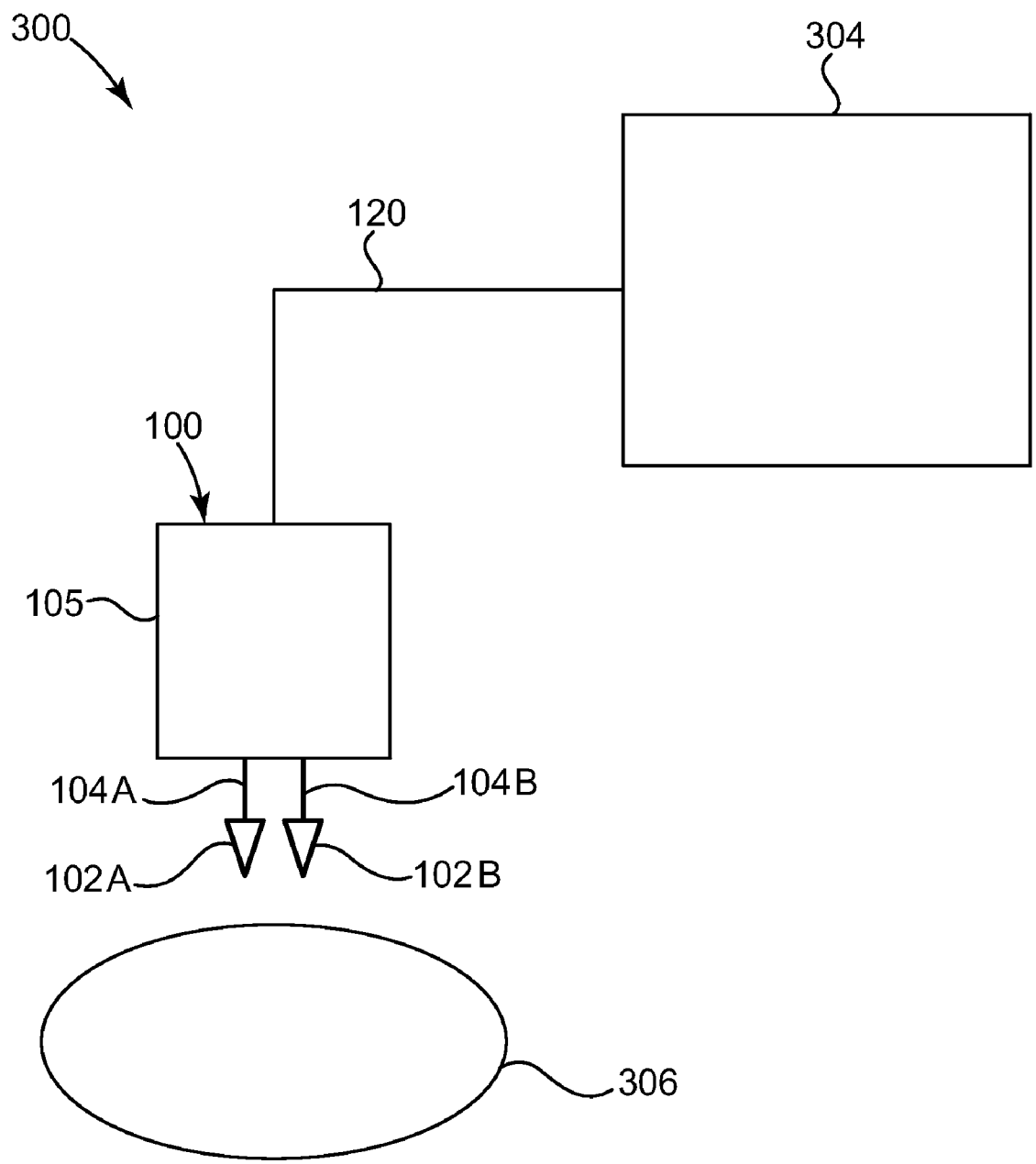
FIG. 4 is a diagram illustrating a testing system for testing a semiconductor chip according to one embodiment.

FIG. 4 is a diagram illustrating a testing system 300 for testing semiconductor chips or devices according to one embodiment. Testing system 300 includes probe device 100 and test equipment 304. Probe device 100 is connected to test equipment 304 via communication link 120. In the illustrated embodiment, semiconductor chips to be tested are arranged on a semiconductor wafer 306. The semiconductor chips include differential circuits that are connected to pads on the wafer 306.

In one embodiment, probe device 100 is configured to test automotive radar chips (e.g., semiconductor chips for adaptive cruise control applications) that are developed using a Silicon Germanium (SiGe) semiconductor processing technology. In one embodiment, probe device 100 is configured to output differential signals in a frequency range of 20 to 100 GHz to a device under test, and receive differential signals in the same frequency range. In another embodiment, probe device 100 is configured to output differential signals in a frequency range of 76 to 81 GHz to a device under test, and receive differential signals in the same frequency range.

In operation according to one embodiment, the probe device 100 is positioned so that the probe tips 102A and 102B come in contact with the pads for a differential circuit on wafer 306. Test equipment 304 supplies a single-ended test signal to probe device 100 via communication link 120. The single-ended test signal is received by balun 112 (FIG. 1) on substrate 105 via the single-ended port 116. Balun 112 converts the received single-ended signal to a corresponding differential test signal, and outputs the differential test signal to the differential circuit on wafer 306 via differential ports 114A and 114B, coaxial conductors 104A and 104B, and probe tips 102A and 102B.

Probe device 100 is also configured to receive differential signals from a differential circuit on wafer 306. The differential circuit on wafer 306 outputs a differential signal through pads on the wafer 306. Probe tips 102A and 102B contact the pads, and receive the differential signal. The differential signal is provided to balun 112 on substrate 105 via coaxial conductors 104A and 104B and differential ports 114A and 114B. Balun 112 converts the received differential signal to a corresponding single-ended signal, and outputs the single-ended signal to test equipment 304 via single-ended port 116 and communication link 120.

One embodiment provides a probe device with an integrated balun for testing differential circuits at relatively high frequencies (e.g., greater than 20 GHz). The probe device with the integrated balun according to one embodiment avoids the tolerance issues associated with the cables and connectors used in conventional approaches, and provides the ability to test semiconductor devices at higher microwave frequencies, while maintaining the 180° phase relation between differential signal components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A probe device for testing a semiconductor chip, comprising:
   a microwave substrate;
   a balun formed on the microwave substrate, the balun including first and second differential ports and a single-ended port;
   first and second probe tips respectively coupled to the first and second differential ports; and
   wherein the first and second probe tips are respectively coupled to the first and second differential ports via respective first and second coaxial conductors, and wherein the first and second coaxial conductors each include an outer conductor connected to a ground plane of the microwave substrate.

2. The probe device of claim 1, wherein the first and second coaxial conductors each include an inner conductor, the inner conductors respectively connected to the first and second differential ports.

3. The probe device of claim 1, wherein the single-ended port is configured to be coupled to test equipment.

4. The probe device of claim 1, wherein the single-ended port is configured to be coupled to a coaxial conductor.

5. The probe device of claim 1, wherein the single-ended port is configured to be coupled to a waveguide.

6. The probe device of claim 1, wherein the balun is one of a ring hybrid balun, delay line balun, and transformer balun.

7. The probe device of claim 1, wherein the balun is a transmission line balun.

8. The probe device of claim 1, wherein the microwave substrate is one of a ceramic substrate, alumina substrate, and Polytetrafluoroethylene (PTFE) substrate.

9. The probe device of claim 1, wherein the probe device is configured to receive single-ended test signals from test equipment via the single-ended port, and output corresponding differential signals to the semiconductor chip via the first and second probe tips.

10. The probe device of claim 1, wherein the probe device is configured to receive differential signals from the semiconductor chip via the first and second probe tips, and output corresponding single-ended signals to test equipment via the single-ended port.

11. The probe device of claim 1, wherein the probe device is configured to operate at frequencies in the range of 20 to 120 GHz.

12. A method for manufacturing a probe device for testing semiconductor chips, the method comprising:
   providing a microwave substrate;
   forming a balun in the microwave substrate, the balun including first and second differential ports and a single-ended port;

coupling first and second probe tips respectively to the first and second differential ports via respective first and second coaxial conductors;

providing a ground plane in the microwave substrate; and connecting an outer conductor of each of the first and second coaxial conductors to the ground plane.

13. The method of claim 12, and further comprising:

connecting an inner conductor of each of the first and second coaxial conductors to respective ones of the first and second differential ports of the balun.

14. The method of claim 12, and further comprising:

forming a connector on the microwave substrate, the connector coupled to the single-ended port and configured to be coupled to test equipment.

15. A method of testing a semiconductor device, comprising:

providing a probe device including a microwave substrate having a balun formed thereon, the balun including first and second differential ports and a single-ended port, the probe device including first and second probe tips respectively coupled to the first and second differential ports via respective first and second coaxial conductors, the first and second coaxial conductors each including an outer conductor connected to a ground plane of the microwave substrate;

contacting the probe tips to pads of the semiconductor device; and performing an electrical test comprising sending a single-ended test signal to the probe device, converting the single-ended test signal to a corresponding differential signal with the balun, and applying the differential signal to the pads of the semiconductor device through the probe tips.

16. The method of claim 15, wherein performing an electrical test further comprises:

receiving a differential signal from the pads of the semiconductor device through the probe tips, converting the differential signal to a corresponding single-ended signal with the balun, and outputting the single-ended signal from the probe device.

* * * * *